(12) United States Patent
Hayashizaki et al.

(10) Patent No.: US 10,859,599 B2
(45) Date of Patent: Dec. 8, 2020

(54) ELECTRICAL CONNECTION APPARATUS

(71) Applicant: Kabushiki Kaisha Nihon Micronics, Tokyo (JP)

(72) Inventors: Takayuki Hayashizaki, Aomori (JP); Hisao Narita, Aomori (JP)

(73) Assignee: Kabushiki Kaisha Nihon Micronics, Musashino (JP)

( * ) Notice: Subject to any disclaimer, the term of this patent is extended or adjusted under 35 U.S.C. 154(b) by 0 days.

(21) Appl. No.: 16/604,541

(22) PCT Filed: Apr. 3, 2018

(86) PCT No.: PCT/JP2018/014247
§ 371 (c)(1),
(2) Date: Oct. 10, 2019

(87) PCT Pub. No.: WO2018/190194
PCT Pub. Date: Oct. 18, 2018

(65) Prior Publication Data
US 2020/0158754 A1 May 21, 2020

(30) Foreign Application Priority Data
Apr. 12, 2017 (JP) .................... 2017-078820

(51) Int. Cl.
*G01R 1/067* (2006.01)
*G01R 1/073* (2006.01)
(52) U.S. Cl.
CPC ..... *G01R 1/06738* (2013.01); *G01R 1/07357* (2013.01)

(58) Field of Classification Search
CPC .................................................. G01R 1/07357
(Continued)

(56) References Cited

U.S. PATENT DOCUMENTS 4,027,935 A * 6/1977 Byrnes ............... G01R 1/07357
439/289
4,423,376 A * 12/1983 Byrnes ................... G01R 1/073
324/750.25
(Continued)

FOREIGN PATENT DOCUMENTS

| CN | 104755943 A | 7/2015 |
|---|---|---|
| JP | H10300786 A | 11/1998 |

(Continued)

*Primary Examiner* — Alexander Gilman
(74) *Attorney, Agent, or Firm* — Lorenz & Kopf, LLP

(57) ABSTRACT

An electrical connection device includes: a probe (10); and a probe head (20) including a top portion (21) allowing penetration of the probe (10), a bottom portion (23) disposed closer to a distal end portion than the top portion (21) and allowing penetration of the probe (10), and an upper guide portion (24) and a lower guide portion (25), which are disposed between the top portion (21) and the bottom portion (23) and allow penetration of the probe (10), wherein the probe (10) is held in a curved state between the top portion (21) and the bottom portion (23), the probe (10) buckles by contact of the distal end portion with an inspection object (2), and at least a continuous portion of the probe (10), which ranges from a portion where the probe (10) in a buckling state penetrates the bottom portion (23) to a portion where the probe (10) penetrates the lower guide portion (25), is a high-rigidity portion (101) made to have higher rigidity than a buckling portion of the probe (10).

4 Claims, 4 Drawing Sheets

(58) Field of Classification Search
USPC .......................................................... 439/482
See application file for complete search history.

(56) References Cited

U.S. PATENT DOCUMENTS

| | | | | |
|---|---|---|---|---|
| 5,055,777 | A * | 10/1991 | Bonelli | G01R 1/07357 324/72.5 |
| 6,150,830 | A * | 11/2000 | Schmid | G01R 1/07357 324/756.03 |
| 6,411,112 | B1 * | 6/2002 | Das | G01R 1/07357 324/754.2 |
| 6,417,684 | B1 * | 7/2002 | Schmid | G01R 1/07357 324/750.25 |
| 7,479,237 | B2 * | 1/2009 | Tsai | G01R 1/07371 216/58 |
| 7,514,948 | B2 * | 4/2009 | Kister | G01R 1/06733 324/755.1 |
| 7,786,740 | B2 * | 8/2010 | Kister | G01R 1/07314 324/754.03 |
| 8,907,689 | B2 * | 12/2014 | Kister | G01R 1/07314 324/754.01 |
| 8,994,393 | B2 * | 3/2015 | Ding | G01R 1/07357 324/755.01 |
| 9,097,740 | B2 * | 8/2015 | Kister | G01R 1/06761 |
| 9,535,091 | B2 * | 1/2017 | Hsu | G01R 31/2601 |
| 9,618,536 | B2 * | 4/2017 | Kuo | G01R 1/07357 |
| 9,702,904 | B2 * | 7/2017 | Breinlinger | G01R 1/06716 |
| 10,119,991 | B2 * | 11/2018 | Chen | G01R 1/07357 |
| 10,215,801 | B2 * | 2/2019 | Nasu | G01R 1/07314 |
| 10,359,447 | B2 * | 7/2019 | Breinlinger | G01R 1/06705 |
| 10,551,433 | B2 * | 2/2020 | Crippa | G01R 1/06733 |
| 2005/0124144 | A1 * | 6/2005 | Sato | G01R 1/07357 438/482 |
| 2008/0186037 | A1 * | 8/2008 | Ko | G01R 1/07342 324/754.07 |
| 2009/0002009 | A1 * | 1/2009 | Brandorff | G01R 1/07357 324/750.16 |
| 2010/0231249 | A1 * | 9/2010 | Dang | G01R 1/0675 324/754.18 |
| 2015/0280345 | A1 | 10/2015 | Kimura et al. | |

FOREIGN PATENT DOCUMENTS

| | | |
|---|---|---|
| JP | 2002202337 A | 7/2002 |
| JP | 2012173263 A | 9/2012 |
| JP | 2015118064 A | 6/2015 |
| TW | 200503225 A | 1/2005 |
| TW | 201033619 A | 9/2010 |
| WO | WO2004072661 A1 | 8/2004 |
| WO | WO2010095521 A1 | 8/2010 |
| WO | WO2014087906 A1 | 6/2014 |

* cited by examiner (a)                    (b)

ELECTRICAL CONNECTION APPARATUS

TECHNICAL FIELD

The present invention relates to an electrical connection device for use in measuring electrical characteristics of an inspection object.

BACKGROUND ART

In order to measure electrical characteristics of an inspection object such as an integrated circuit in a state where the inspection object is not separated from a wafer, an electrical connection device including probes to be brought into contact with the inspection object is used. For the electrical connection device, there is used a configuration in which a probe head that holds probes is attached to an electrode substrate on which electrode pads electrically connecting to the probes are arranged, or the like.

The probes are held, for example, in a state of penetrating guide holes provided in the probe head. At this time, two guide holes arranged along an axial direction of each of the probes are arranged while shifting positions thereof, whereby the probes are held diagonally inside the probe head. With this configuration, when a plurality of the probes are brought into contact with the inspection object, these probes buckle in the same direction, and the adjacent probes are suppressed from contacting one another (for example, refer to PTL 1).

CITATION LIST

Patent Literature

PTL 1—Japanese Patent Laid-Open Publication No. 2015-118064

SUMMARY OF INVENTION

Technical Problem

However, the probes slide through the insides of the guide holes between a state of contacting the inspection object and a state of not contacting the same, whereby side surfaces of the probes are rubbed by opening portions of the guide holes. As a result, a problem that the probes are damaged occurs.

In consideration of the above-described problem, it is an object of the present invention to provide an electrical connection device capable of suppressing the damage of the probes, which results from the slide of the probes in the guide holes provided in the probe head.

Solution to Problem

In accordance with an aspect of the present invention, there is provided an electrical connection device including: a probe in which a distal end portion contacts an inspection object during measurement; and a probe head having a top portion allowing penetration of the probe, a bottom portion disposed closer to the distal end portion than the top portion and allowing penetration of the probe, and a guide portion disposed between the top portion and the bottom portion and allowing penetration of the probe, the probe buckles by contact of the distal end portion with the inspection object, and at least a continuous portion of the probe, the continuous portion ranging from a portion where the probe in a buckling state penetrates the bottom portion to a portion where the probe penetrates the guide portion, is a high-rigidity portion made to have higher rigidity than a buckling portion of the probe.

Advantageous Effects of Invention

In accordance with the present invention, there can be provided the electrical connection device capable of suppressing the damage of the probes, which results from the slide of the probes in the guide holes provided in the probe head.

BRIEF DESCRIPTION OF DRAWINGS

FIG. 2(a) illustrates a non-contact state; and FIG. 2(b) illustrates a contact state.

DESCRIPTION OF EMBODIMENT

Figure 1:
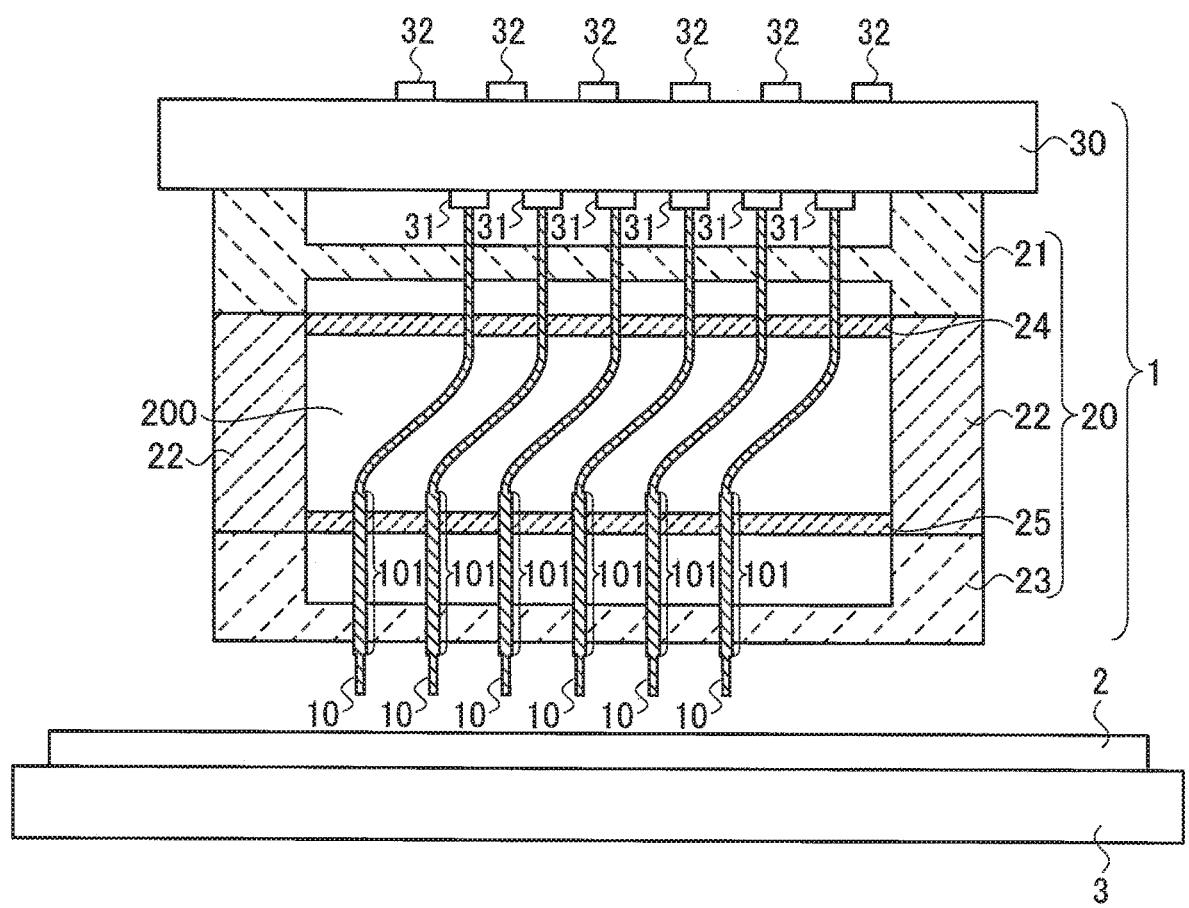
FIG. 1 is a schematic diagram illustrating a configuration of an electrical connection device according to a first embodiment of the present invention.

Next, a description will be given of embodiments of the present invention with reference to the drawings. In the following description referring to the drawings, the same or similar reference numerals are assigned to the same or similar portions. However, it should be noted that the drawings are schematic, and that a ratio of thicknesses of respective portions, and the like are different from actual ones. Moreover, as a matter of course, also between the drawings, portions where dimensional relationship and ratio therebetween are different from each other are also included. The embodiments illustrated below are exemplifying a device and a method for embodying the technical idea of this invention, and the embodiments of this invention do not specify materials, shapes, structures, dispositions and the like of constituent components to those described below.

First Embodiment

An electrical connection device 1 according to a first embodiment of the present invention, which is illustrated in FIG. 1, is used for measuring electrical characteristics of an inspection object 2. The electrical connection device 1 includes probes 10, and a probe head 20 having a top portion 21 allowing penetration of the probes 10, and having a bottom portion 23 disposed closer to distal end portions than the top portion 21 and allowing the penetration of the probes 10. The probe head 20 has an upper guide portion 24 and a lower guide portion 25, which are disposed between the top portion 21 and the bottom portion 23 and allow the penetration of the probes 10.

In order to constitute a hollow region 200 between the top portion 21 and bottom portion 23 of the probe head 20, a spacer 22 is disposed between an outer edge region of the top portion 21 and an outer edge region of the bottom portion 23. A plate-shaped upper guide portion 24 is disposed at a position in the inside of the hollow region 200, the position being close to the top portion 21. Moreover, at a position in the inside of the hollow region 200, the position being close to the bottom portion 23, a plate-shaped lower guide portion 25 is disposed parallel to the upper guide portion 24. For the probe head 20, a ceramic material, a polyimide synthetic resin material or the like is used.

The probes 10 of which distal end portions contact the inspection object 2 during the measurement of the inspection object 2 penetrate the bottom portion 23, the lower guide portion 25, the upper guide portion 24 and the top portion 21 in this order. In portions which allow the penetration of the probes 10, guide holes which are not illustrated in FIG. 1 are individually formed in the bottom portion 23, the lower guide portion 25, the upper guide portion 24 and the top portion 21.

When viewed in a direction of a surface normal line of a main surface of the bottom portion 23, positions of the guide holes of the top portion 21 and the guide holes of the bottom portion 23, both of the guide holes allowing passage of the same probes 10, are arranged to be shifted parallel to the main surface (hereinafter, this arrangement will be referred to as "offset arrangement"). In the example illustrated in FIG. 1, the guide holes of the bottom portion 23 are arranged to be shifted to the left side of FIG. 1 with respect to the guide holes of the top portion 21. By the offset arrangement, the probes 10 are held diagonally inside the hollow region 200, and the probes 10 are curved due to elastic deformation.

Meanwhile, positions of the guide holes of the top portion 21 and the guide holes of the upper guide portion 24 substantially coincide with each other when the main surface is viewed from the above. Moreover, positions of the guide holes of the bottom portion 23 and the guide holes of the lower guide portion 25 substantially coincide with each other when the main surface is viewed from the above. As illustrated in FIG. 1, the probes 10 are curved between the upper guide portion 24 and the lower guide portion 25.

The electrical connection device 1 further includes an electrode substrate 30 on which electrode pads 31 electrically connecting to proximal end portions of the probes 10 are arranged. The proximal end portions of the probes 10 which protrude to an upper surface of the top portion 21 of the probe head 20 facing the electrode substrate 30 connect to the electrode pads 31 arranged on a lower surface of the electrode substrate 30 facing the probe head 20.

The electrode pads 31 of the electrode substrate 30 are electrically connected to connection pads 32, which are arranged on an upper surface of the electrode substrate 30, by electrode wires (not illustrated) arranged inside the electrode substrate 30. The connection pads 32 are electrically connected to an inspection device such as an IC tester (not illustrated). Predetermined voltage and current are applied through the probes 10 to the inspection object 2 by the inspection device. Then, signals output from the inspection object 2 are sent through the probes 10 to the inspection device, and the characteristics of the inspection object 2 are inspected.

The electrical connection device 1 illustrated in FIG. 1 is a vertical operation-type probe card. The distal end portions of the probes 10, which are exposed to a lower surface of the bottom portion 23 of the probe head 20, contact inspecting pads (not illustrated) of the inspection object 2, which are disposed below the electrical connection device 1. FIG. 1 illustrates a state where the probes 10 are not in contact with the inspection object 2. For example, a chuck 3 on which the inspection object 2 is mounted rises, and the distal end portions of the probes 10 contact the inspection object 2.

When the distal end portions of the probes 10 of which proximal end portions are connected to the electrode pads 31 contact the inspection object 2, the probes 10 buckle in the hollow region 200. That is, between the upper guide portion 24 and the lower guide portion 25, the probes 10 are curved more largely due to flexural deformation.

The guide holes of the top portion 21 and the guide holes of the bottom portion 23 are subjected to the offset arrangement, whereby the plurality of probes 10 are elastically deformed with the same shape in the same direction in the hollow region 200. At this time, each of the probes 10 is held by the upper guide portion 24 and the lower guide portion 25, whereby the probes 10 adjacent to one another in the hollow region 200 are prevented from contacting one another.

As described above, the probes 10 are deformed from a curved shape in the non-contact state where the probes 10 are not in contact with the inspection object 2 to a further curved shape in the state where the probes 10 are in contact with the inspection object 2, whereby the probes 10 contact the inspection object 2 with a predetermined pressure. In this way, the electrical characteristics of the inspection object 2 can be measured by using the probes 10. After the electrical characteristics of the inspection object 2 are measured, the chuck 3 that mounts the inspection object 2 thereon goes down, whereby the probes 10 and the inspection object 2 turn to the non-contact state.

The probes 10 have elasticity to return to the shape before contacting the inspection object 2 when the probes 10 and the inspection object 2 turn to the non-contact state. Tungsten (W) or the like is used as a material of the probes 10. Alternatively, a copper (Cu) alloy, a palladium (Pd) alloy, a nickel (Ni) alloy, a W alloy or the like is used as a material of the probes 10.

In the electrical connection device 1, at least continuous portions of the probes 10, which range from portions where the probes 10 in the buckling state penetrate the bottom portion 23 to portions where the probes 10 penetrate the lower guide portion 25, are made to have higher rigidity than the buckling portions of the probes 10. In FIG. 1, the portions of the probes 10, which are made to have higher elasticity than the buckling portions thereof, are illustrated as "high-rigidity portions 101". The high-rigidity portions 101 illustrated in FIG. 1 are portions closer to the bottom portion 23 than the buckling portions of the probes 10. That is, the continuous portions, which range from the portions penetrating the bottom portion 23 to the portions penetrating the lower guide portion 25 adjacent to the bottom portion 23 between the upper guide portion 24 and the lower guide portion 25, are the high-rigidity portions 101 of the probes 10.

Figure 2:
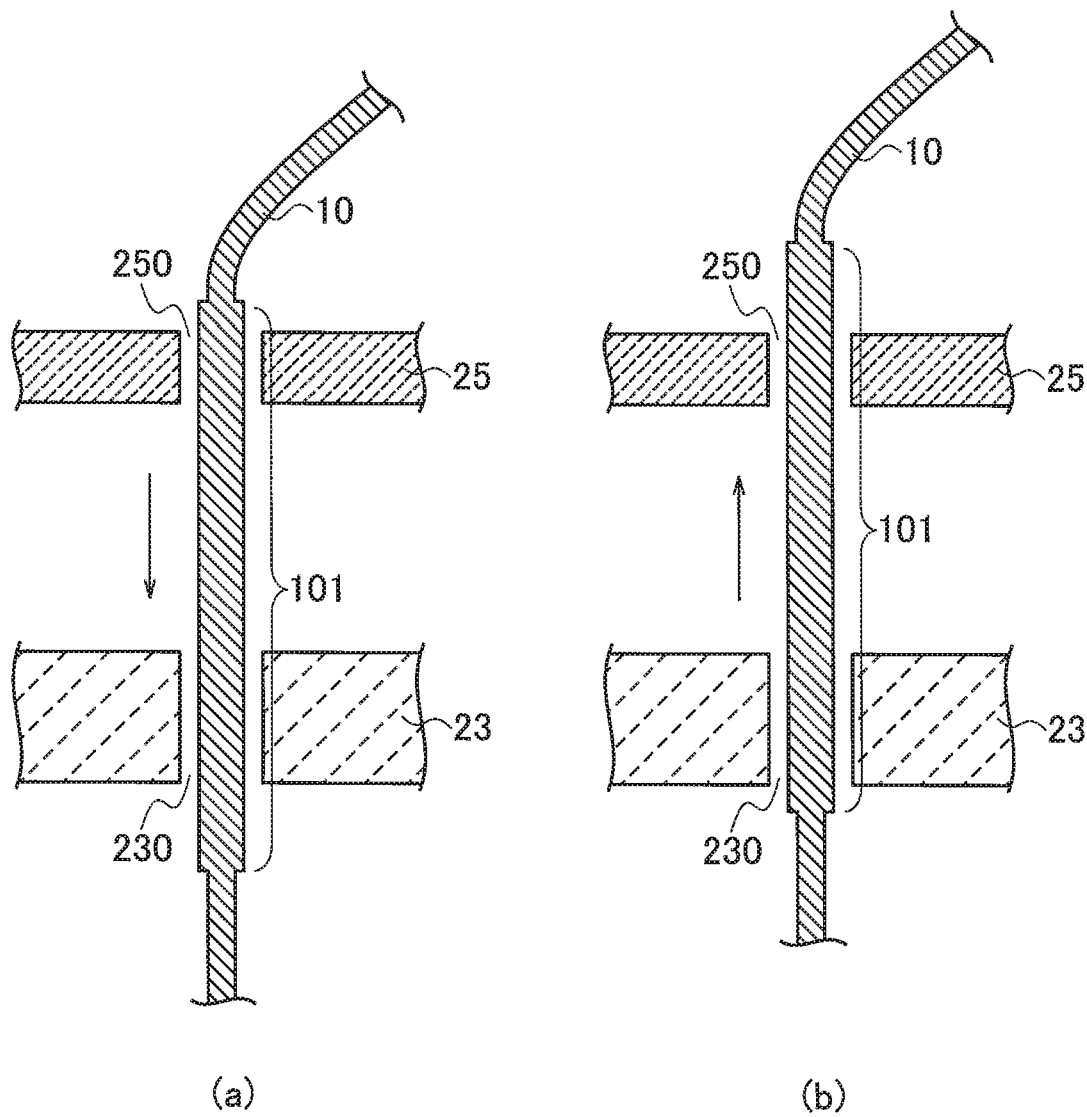
FIG. 2 is schematic diagrams illustrating a configuration of a probe head of the electrical connection device according to the first embodiment of the present invention.

The high-rigidity portions 101 are the continuous portions of the probes 10, which range from portions thereof passing through the guide holes of the bottom portion 23 to portions thereof passing through the guide holes of the lower guide portion 25, in both of a state where the probes 10 buckle and a state where the probes 10 do not buckle. An example of the high-rigidity portions 101 will be described with reference to FIG. 2(a) and FIG. 2(b). FIG. 2(a) illustrates a state of each of the probes 10 in the non-contact state where the probe 10 is not in contact with the inspection object 2. An arrow illustrated in FIG. 2(*a*) indicates a sliding direction of the probe 10 at the time when the probe 10 transitions from the contact state to the non-contact state. FIG. 2(*b*) illustrates a state of the probe 10 in the state where the probe 10 is in contact with the inspection object 2. An arrow illustrated in FIG. 2(*b*) indicates a sliding direction of the probe 10 at the time when the probe 10 transitions from the non-contact state to the contact state.

In both of the non-contact state and the contact state, a diameter of the high-rigidity portion 101 of the probe 10, which ranges from a portion thereof facing a guide hole 230 of the bottom portion 23 to a portion thereof facing a guide hole 250 of the lower guide portion 25, is set to be larger than diameters of other portions of the probe 10, which include the buckling portion. Therefore, as illustrated in FIG. 2(*a*) and FIG. 2(*b*), the probe 10 has a linear shape without being curved in a region ranging from an upper surface of the bottom portion 23 to a lower surface of the lower guide portion 25. In this way, the probe 10 is prevented from being brought into point contact with an opening portion of the guide hole 250 of the lower guide portion 25.

Figure 3:
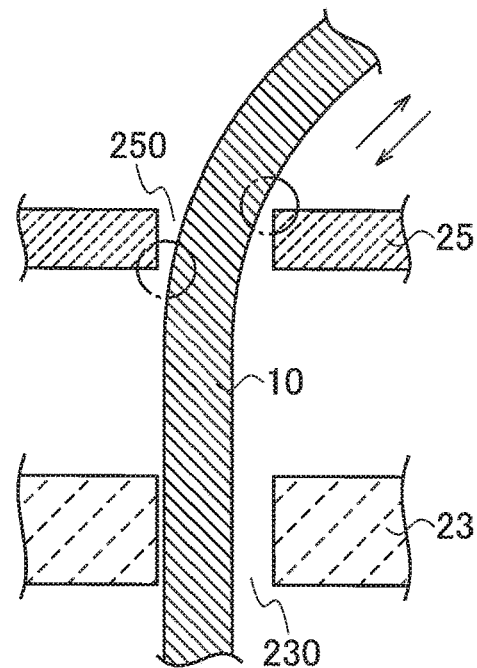
FIG. 3 is a schematic diagram illustrating a configuration of a probe head of an electrical connection device of a comparative example.

In contrast, when the high-rigidity portion 101 is not provided in the probe 10, as illustrated in FIG. 3, the probe 10 buckles, whereby the probe 10 slides inside the guide hole 250 of the lower guide portion 25 diagonally with respect to a centerline of the guide hole 250. Therefore, the probe 10 is brought into point contact with the opening portion of the guide hole 250. In FIG. 3, the sliding directions of the probe 10 are illustrated by arrows, and contacts spots of the lower guide portion 25 with the probe 10 are illustrated by being surrounded by circles of broken lines (the same applies below). In such a comparative example illustrated in FIG. 3, the probe 10 is brought into point contact with an opening portion of the guide hole 250, and accordingly, a damage such as surface abrasion and peeling occurs in the probe 10.

Figure 4:
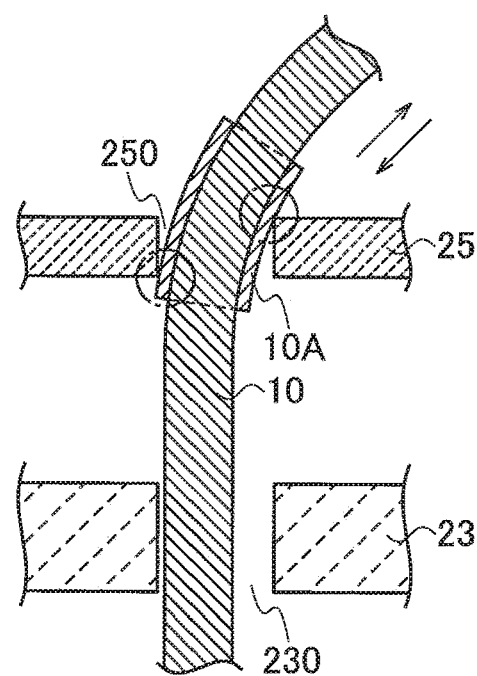
FIG. 4 is a schematic diagram illustrating a configuration of a probe head of an electrical connection device of another comparative example.

Moreover, in order to prevent the damage of the probe 10, which results from the fact that the probe 10 and the lower guide portion 25 are brought into point contact with each other, as in a comparative example illustrated in FIG. 4, a countermeasure of covering, with a hard metal film 10A, the contact spots of the probe 10 with the lower guide portion 25 is conceived. However, even if only rigidity of the contact spots of the probe 10 with the lower guide portion 25 is increased, the probe 10 slides inside the guide hole 250 diagonally with respect to the centerline of the guide hole 250. Hence, the probe 10 continues to be brought into point contact with the opening portion of the guide hole 250, and abrasion of the hard metal film 10A occurs at contact spots. Hence, in the comparative example illustrated in FIG. 4, such a problem that the probe 10 is damages cannot be fundamentally solved.

In contrast, in the electrical connection device 1, such a portion of the probe 10, which ranges from the portion thereof sliding inside the guide hole 230 of the bottom portion 23 to the portion thereof sliding inside the guide hole 250 of the lower guide portion 25, is continuously formed as the high-rigidity portion 101. Therefore, the probe 10 slides inside the guide hole 250 substantially parallel to the centerline of the guide hole 250 of the lower guide portion 25. Hence, the probe 10 is not brought into point contact with the opening portion of the guide hole 250. As a result, the damage of the probe 10, which results from the abrasion with the opening portion of the guide hole 250, can be suppressed.

Note that, preferably, an outer diameter of the high-rigidity portion 101 of the probe 10 is made slightly thinner than an inner diameter of the guide hole 250 to an extent where the probe 10 can smoothly slide inside the guide hole 250. As a difference between the outer diameter of the high-rigidity portion 101 and the inner diameter of the guide hole 250 is smaller, the probe 10 becomes more linear in the inside of the guide hole 250. Therefore, even if the probe 10 and the guide hole 250 contact each other when the probe 10 slides, a side surface of the probe 10 is brought into surface contact with an inner wall surface of the guide hole 250 without being brought into point contact with the opening portion of the guide hole 250. Hence, the damage of the probe 10 can be suppressed.

For example, when an outer diameter of the buckling portion of the probe 10 is 30±2 and the outer diameter of the high-rigidity portion 101 is approximately 37±2 then the inner diameter of the guide hole 250 is set to approximately 47±2.

To the buckling portion and high-rigidity portion 101 of the probe 10, a rigidity difference therebetween is provided to an extent where, when the probe 10 and the inspection object 2 are brought into contact with each other, the high-rigidity portion 101 does not warp while the buckling portion warps. In this way, the probe 10 contacts the inspection object 2 with a predetermined pressure generated in such a manner that the probe 10 buckles at the contact time, and in addition, abrasion resistance of the probe 10 can be improved.

As described above, in the electrical connection device 1 according to the first embodiment of the present invention, at least the portion of the probe 10, which ranges from the portion thereof passing through the bottom portion 23 to the portion thereof penetrating the lower guide portion 25 in the state where the probe 10 buckles, is the continuous high-rigidity portion 101. Therefore, the probe 10 slides inside the guide hole 250 of the lower guide portion 25, in a linear shape. In this way, the probe 10 is prevented from being brought into point contact with the opening portion of the guide hole 250. Hence, in accordance with the electrical connection device 1 illustrated in FIG. 1, the damage of the probe 10, which results from the slide of the probe 10 in the guide hole provided in the probe head 20 can be suppressed.

Second Embodiment

Figure 5:
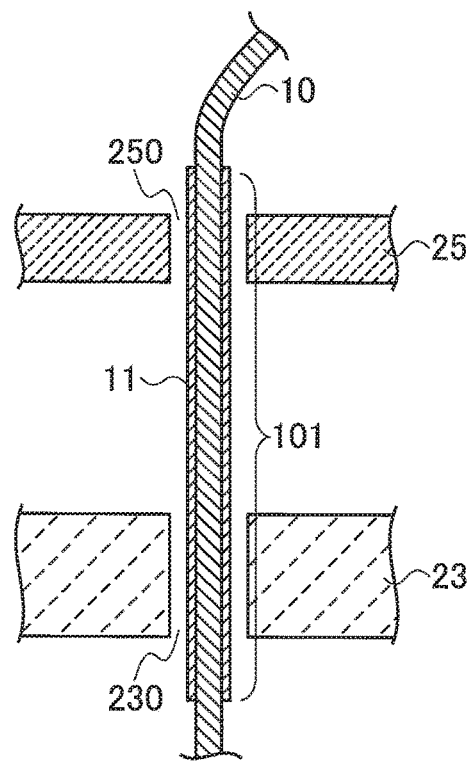
FIG. 5 is a schematic diagram illustrating a configuration of a probe head of an electrical connection device according to a second embodiment of the present invention.

As illustrated in FIG. 5, an electrical connection device 1 according to a second embodiment of the present invention is configured in such a manner that the high-rigidity portion 101 of the probe 10 is covered with a hard film 11 made of a film harder than the buckling portion. That is, the second embodiment is different from the first embodiment in that the abrasion resistance is improved by continuously covering, with such a hard film 11 having high hardness, the portion of the probe 10, which ranges from the portion penetrating the bottom portion 23 to the portion penetrating the lower guide portion 25. Other configurations are the same as those of the first embodiment illustrated in FIG. 1.

In accordance with the electrical connection device 1 illustrated in FIG. 5, the high-rigidity portion 101 of the probe 10, which is covered with the hard film 11, has a linear shape. Therefore, the probe 10 is prevented from being brought into point contact with the opening portion of the guide hole 250 of the lower guide portion 25.

Note that a material of the hard film 11 that covers the high-rigidity portion 101 of the probe 10 may be a conductive material or a non-conductive material. For example, not only the hard metal film is used for the hard film 11, but also glass, a ceramic material or the like can be used for the hard film 11. Alternatively, the high-rigidity portion 101 may be configured by DLC coating.

Moreover, the high-rigidity portion 101 is covered with the hard film 11, whereby the diameter of the high-rigidity portion 101 of the probe 10 is increased. At this time, preferably, a difference between the outer diameter of the high-rigidity portion 101 and the inner diameter of the guide hole 250 is smaller. In this way, even if the probe 10 contacts the lower guide portion 25 at the time of sliding inside the guide hole 250, the side surface of the probe 10 is brought into surface contact with the inner wall surface of the guide hole 250.

As described above, in accordance with the electrical connection device 1 according to the second embodiment of the present invention, the damage of the probe 10, which results from the slide of the probe 10 in the guide holes provided in the probe head 20, can be suppressed. Others are substantially similar to those of the first embodiment, and a duplicate description will be omitted.

Other Embodiments

As above, the present invention has been described by the embodiments; however, it should not be understood that the description and the drawings, which form a part of this disclosure, limit the present invention. For those skilled in the art, varieties of alternative embodiments, examples and application technologies will be obvious from this disclosure.

Figure 6:
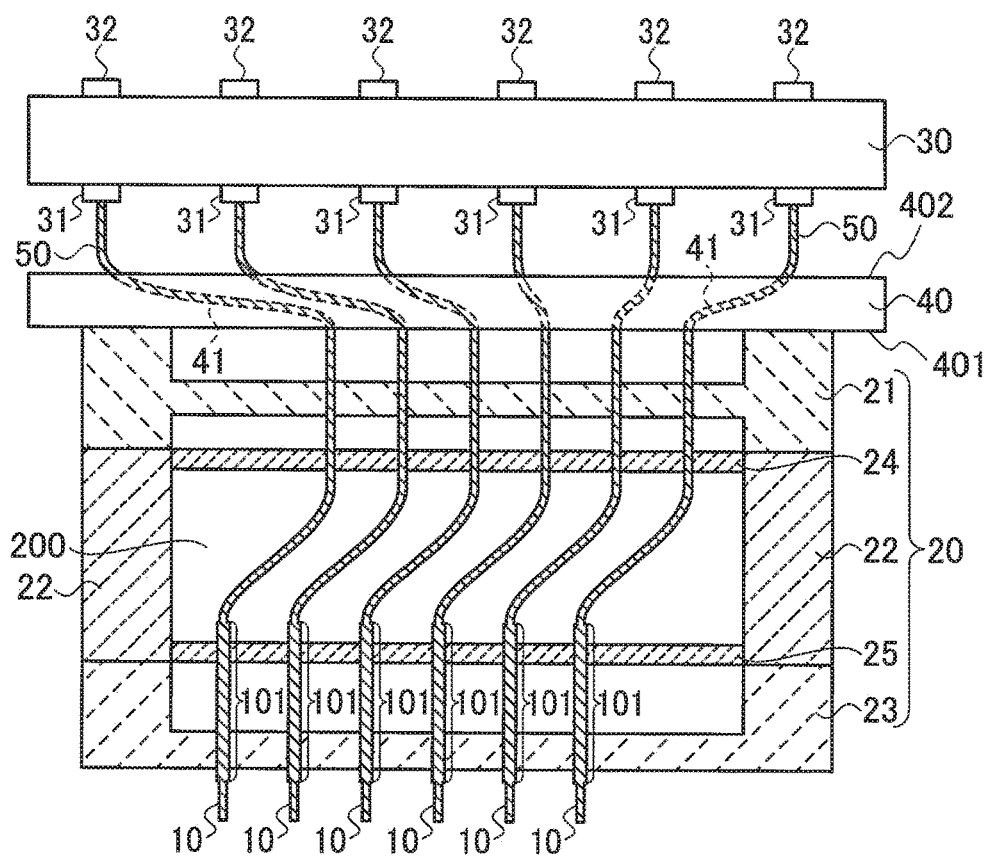
FIG. 6 is a schematic diagram illustrating a configuration of an electrical connection device according to another embodiment of the present invention.

For example, as illustrated in FIG. 6, in order to increase an interval between the electrode pads 31 arranged on the electrode substrate 30 more than an interval between the proximal end portions of the probe 10, a space transformer 40 may be disposed between the probe head 20 and the electrode substrate 30. The space transformer 40 has connection wires 41 which penetrate portions from a first main surface 401 to a second main surface 402, which face each other. One-side terminals of the connection wires 41 are arranged on the first main surface 401, and connect to the proximal end portions of the probes 10. Other-side terminals of the connection wires 41 are arranged on the second main surface 402, and electrically connect to the electrode pads 31 of the electrode substrate 30. The connection wires 41 and the electrode pads 31 are connected to each other, for example, by conductivity wires 50.

Use of the space transformer 40 increases the interval between the electrode pads 31 of the electrode substrate 30 and the interval between the connection pads 32 thereof, thus making it easy to make a layout of electrode wires in the inside of the electrode substrate 30. Moreover, a step of connecting the electrode substrate 30 and the inspection device to each other becomes easy.

As described above, it is natural that the present invention incorporates a variety of embodiments which are not described herein.

INDUSTRIAL APPLICABILITY

The electrical connection device of this embodiment is applicable to the characteristic measurement field of objects to be inspected.

The invention claimed is:

1. An electrical connection device for use in measuring electrical characteristics of an inspection object, comprising:
   a probe in which a distal end portion contacts the inspection object during measurement; and
   a probe head including: top portion allowing penetration of the probe; a bottom portion disposed closer to a distal end portion than the top portion and allowing penetration of the probe, and a guide portion disposed between the top portion and the bottom portion and allowing penetration of the probe,
   wherein the probe is held in a curved state between the top portion and the bottom portion,
   the probe buckles by contact of the distal end portion with the inspection object,
   at least a continuous portion of the probe, the continuous portion ranging from a portion where the probe in a buckling state penetrates the bottom portion to a portion where the probe penetrates the guide portion, is a high-rigidity portion made to have higher rigidity than a buckling portion of the probe, and
   a length of the high-rigidity portion that penetrates an inside of a guide hole of the bottom portion and that penetrates an inside of a guide hole of the guide portion has a linear shape without being curved.

2. The electrical connection device according to claim 1, wherein a diameter of the high-rigidity portion of the probe is larger than a diameter of the buckling portion.

3. The electrical connection device according to claim 1, wherein the high-rigidity portion of the probe is covered with a material harder than the buckling portion.

4. The electrical connection device according to claim 1, wherein, between the top portion and the bottom portion,
   the probe head includes a plurality of guide portions allowing penetration of the probes, and
   a continuous portion ranging from a portion penetrating the bottom portion to a portion penetrating a guide portion adjacent to the bottom portion among the plurality of guide portions is the high-rigidity portion of the probe.

\* \* \* \* \*